United States Patent [19]

Dudek et al.

[11] Patent Number: 5,167,989
[45] Date of Patent: Dec. 1, 1992

[54] PROCESS FOR COATING SURFACES MADE TACKY BEFOREHAND

[75] Inventors: Dietmar Dudek, Oberursel; Reiner Stoll, Seligenstadt; Thomas Pfeiffer, Dietzenbach, all of Fed. Rep. of Germany; Robert W. Hooley, Wilmington, Del.

[73] Assignee: E. I. du Pont de Nemours and Company, Wilmington, Del.

[21] Appl. No.: 261,564

[22] Filed: Oct. 24, 1988

[30] Foreign Application Priority Data

Oct. 28, 1987 [DE] Fed. Rep. of Germany ....... 3736391

[51] Int. Cl.$^5$ .............................................. B05D 1/12
[52] U.S. Cl. ................................ 427/202; 427/204; 427/205; 427/197; 427/346; 118/57
[58] Field of Search ............... 427/180, 202, 204, 205, 427/197, 96, 184, 57, 346, 347; 118/57

[56] References Cited

U.S. PATENT DOCUMENTS

| | | | |
|---|---|---|---|
| 2,603,575 | 7/1952 | Schramm | 118/57 X |
| 2,770,556 | 11/1956 | Grangaard et al. | 118/63 X |
| 2,903,376 | 9/1959 | Donahue | 427/184 |
| 3,012,901 | 12/1961 | Reese | 427/197 X |
| 3,013,891 | 12/1961 | Block | 118/57 X |
| 3,323,935 | 6/1967 | Snyder | 427/184 |
| 3,389,010 | 6/1968 | Burch | 427/185 |
| 4,278,702 | 7/1981 | Jenq | 427/192 |
| 4,327,124 | 4/1982 | Des Marais | 427/192 X |
| 4,687,825 | 8/1987 | Sagou et al. | 427/54.1 |
| 4,772,345 | 9/1988 | Sagou | 118/57 X |

OTHER PUBLICATIONS

Research Disclosure No. 15882, R. W. Peiffer and R. W. Woodruff, "An Improved Power Toning Process," Published Jun., 1977.

*Primary Examiner*—Shrive Beck

[57] ABSTRACT

Process for coating tacky surface areas of an object, e.g., polymer surfaces making tacky areas by irradiation, commprising bringing particulate coating material, e.g., pigments, metals, etc., into contact with the tacky surface areas, and removing excess particulate coating material particularly from non-tacky areas, the particulate coating material being compressed beyond its bulk density by continuous vibration for at least a part of the time the particulate coating material is in contact with the surface to be coated. The process is useful in the preparation of color TV screens, electrical circuits, etc.

17 Claims, 3 Drawing Sheets

PROCESS FOR COATING SURFACES MADE TACKY BEFOREHAND

TECHNICAL FIELD OF THE INVENTION

The invention relates to a process for coating tacky surface areas of an object with particulate coating material.

BACKGROUND OF THE INVENTION

Various processes for the toning of tacky, particularly imagewise tacky, surfaces are known from U.S. Pat. Nos. 3,060,024; 3,391,455; 3,506,483; 3,637,385; 3,649,268 and 4,019,821. In these known processes, the toning is performed with the use of mechanical devices to distribute and incorporate the toner particles in the tacky surface areas by means of brushes, cotton swabs, etc. A prerequisite for the practicability of this process is a distinct difference in hardness between the tacky and nontacky surface areas. Due to the hardness of the nontacky surface areas, there is no risk that the surface in these nontacky areas is damaged by mechanical forces during toning and that toner particles are incorporated in an undesirable manner. If the nontacky surface areas have sufficient hardness, toner particles, which remain on the nontacky surface after toning and thus interfere with the powder image, can be removed with the use of mechanical means, for example, wiped off.

However, these cited processes are disadvantageous, due to the mechanical energy used if extremely finely divided toner (about 1 to 2 μm average grain size) has to be applied, if the hardness in the nontacky surface area is low, if uneven, curved or dome-shaped surfaces have to be toned or particularly, if there is little difference in hardness between the tacky and nontacky surface areas. The size of the bristles or the fibers in the brushes or swabs is at least several micrometers (μm), so that the so-called stain, a smear from the finest particles, cannot be wiped away by these means after toning. Moreover, these materials are so hard that the nontacky but relatively soft surface can be damaged easily and the fine toner particles can collect in these damage indentations. Furthermore, brushes and swabs adapt poorly or not at all to textured or uneven surfaces.

Other known toning processes are based on the generation and use of a free-flowing toner layer, for example, immersion of the surface to be toned in a fluidized bed (R. W. Peiffer and R. W. Woodruff, Research Disclosure 15882, June, 1977); these result in powder images of lower coverage. Free-flowing toner zones are useful rather for the toning of surfaces differing little in hardness, but much in tackiness. However, the disadvantage of these methods is that, due to the highly dispersed toner, particulate images of extremely low volume density and low uniformity result.

Finally, U.S. Pat. No. 4,687,825 discloses a process for coating fluorescent screens with phosphor, in which process the fluorescent screen to be coated, on an axis right-angled on all sides to its previously tackified surface to be coated, is rotated at an incline to this axis and the phosphor is applied onto this surface as fine particles before or during rotation. To facilitate the distribution of the phosphor over the surface to be coated, the fluorescent screen can also be vibrated during rotation. In this process as well, only very low volume density and low coating uniformity can be attained, because, during the rotation of the fluorescent screen, the coating material, that is, the phosphor, only slides off the tacky surface; this sliding effect is even increased by the vibration, and the tendency of the phosphor to adhere to the tacky surface is reduced.

The low volume density attainable with fluidized bed coating and rotation coating is not suitable for many applications. This applies particularly, for example, when metal powder patterns have to be converted by fusion into continuous metal films.

Consequently, an object of the invention is to provide a process for the coating of tacky or previously tackified surfaces, with which process imagewise coatings are prepared from finely divided powders in the tacky areas with a uniform powder image of high packing density and high toner quantity takeup with good reproducibility, even if the tacky areas and nontacky areas differ only slightly in hardness, in which process no adhering particles or only particles adhering by electrostatic charge remain in the nontacky areas and all constituents of the toner are incorporated in the same manner in the tacky areas so that no change in the toner is supposed to occur in its composition and its properties.

SUMMARY OF THE INVENTION

In accordance with this invention there is provided a process for coating tacky surface areas of a shaped object with particulate coating material comprising: (a) bringing the particulate coating material into contact with the surface to be coated containing tacky surface areas, and (b) removing excess particulate coating material, the improvement wherein the particulate coating material in contact with the surface to be coated is compressed beyond its bulk density by continuous vibration for at least a portion of the time the particulate coating material is in contact with the surface to be coated, and after cessation of contact of the particulate coating material with the surface to be coated, remaining loose particulate coating material is removed from the coated surface.

BRIEF DESCRIPTION OF THE DRAWINGS

In the accompanying drawings forming a material part of this disclosure.

DETAILED DESCRIPTION OF THE INVENTION

Figure 1:
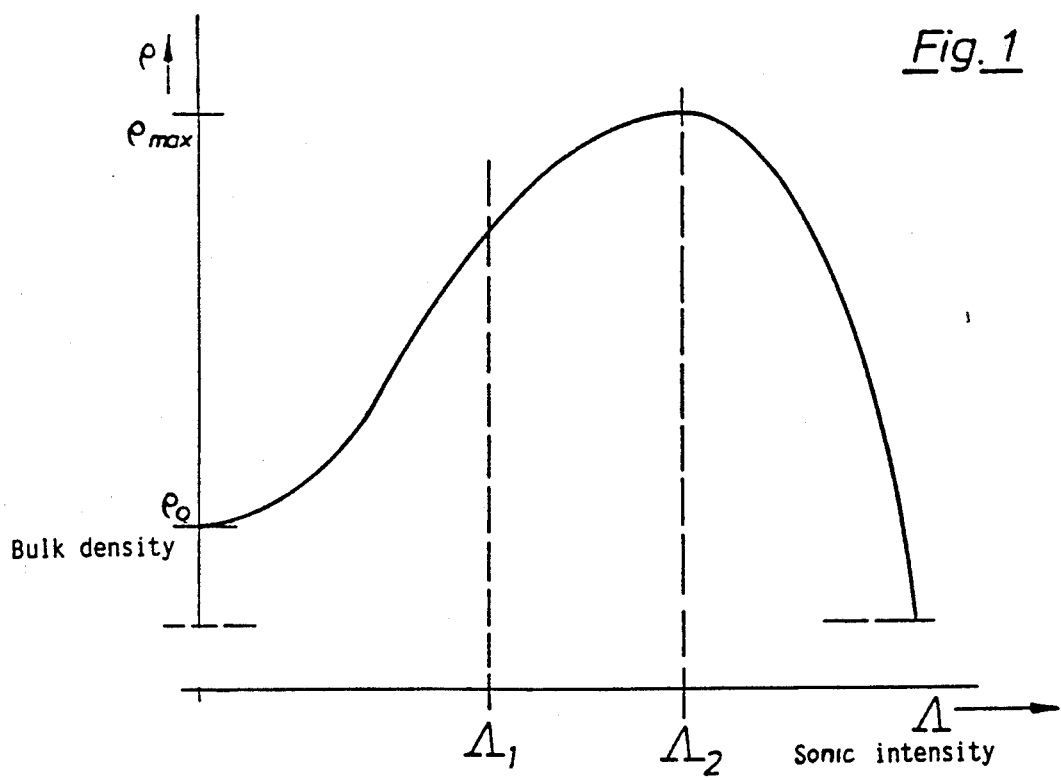
FIG. 1 is a curve related to the density of a layer of particulate coating material as a function of the sonic intensity applied to the layer (applied sound capacity per area unit)

Coating with the use of vibration can be performed with any particulate or powdered coating material, particularly with extremely finely divided coating material, the average grain size of which is about 0.5 µm to 10 µm. The coating process of the invention by means of vibration is remarkable in that the differentiation between tacky and nontacky surface areas is outstanding even with low differences in hardness. Thus, it is surprising that surfaces of low hardness can be treated safely with vibration in the process of the invention and stain formation is clearly reduced. The imagewise coating can be performed in the process of the invention on surfaces of any contour and any surface profile as well as on flat surfaces. Useful tacky surfaces, for example, are disclosed in U.S. Pat. Nos. 3,649,268 and 4,604,340, the disclosures of which are incorporated herein by reference.

In this process, significantly increased coverage of the coated surfaces, thus a considerably increased coating density, occurs surprisingly compared to existing processes. It is particularly surprising in the process of the invention that the vibration used causes a self-cleaning effect that clearly reduces stain formation on the treated surface. The coating performed in the process of the invention is outstanding for good reproducibility.

In an especially advantageous embodiment of the process of the invention, the surface to be treated is faced upward and a layer of particulate or powdered coating or toning material is brought into contact with this material, whereby the vibration is induced from the surface to be treated and/or against the surface to be treated into the layer of powdered coating material. Thus, the coating material is deposited with compressing on the surface to be treated. Thereby, the layer of powdered coating material can be applied onto the treatment surface after the article bearing this surface has already been set into vibration. However, it is also possible to apply the powdered coating material onto the surface to be treated and then to start the vibration that compresses the coating material. A further possibility for performing this embodiment of the process of the invention consists of turning the article in the vibrating state with its surface to be coated upward and then depositing the layer of powdered coating material.

The first embodiment of the process of the invention with its sundry variation possibilities offers the particular advantage that the powdered coating material deposits as a layer on the surface to be treated and thereby can be incorporated particularly effectively into the tacky surface areas by means of the vibration.

Another embodiment of the process of the invention provides that the surface to be treated is placed on the vibrating, compressed powdered coating material. In this embodiment of the invention, contact pressure can be exerted by the weight of the shaped object or article bearing the surface to be treated or also in another manner on the layer of powdered coating material being compressed by the vibration. The magnitude of this contact pressure can be determined in advance commensurate with the extent of tackiness and the hardness of the nontacky surface areas as well as the type of the respective coating material. A hard surface of the non-tacky areas can tolerate a higher contact pressure than a softer surface without becoming stained. The more tacky the surface is, the lower the contact pressure necessary for good toning. Both properties, hardness and tackiness, depend on the nature and composition of the tacky surface.

In a further embodiment of the invention, the article with its surface to be treated can be immersed in the vibrating, compacted, powdered coating material.

In all embodiments of the process of the invention, it is recommended that, after the termination of the coating and the removal of the layer of loose, powdered coating material from the surface of the article, remaining powdered material not bonded to the surface of the article be blown from the surface by means of a stream of gaseous medium. This blowing off or flushing off of the treated surface by means of a gaseous medium yields in the process of the invention practically complete removal of loose, powdered coating material and prevents the formation of stain.

Additionally, the layer of coating material formed in the process of the invention can be further compressed and optionally fixed, e.g., by heat, solutions of polymeric binders which can be sprayed, for example, onto the toned image, as well as aqueous solution of sodium silicate, after the removal of the remaining loose coating material.

In the formation of electrically conducting surface areas within the scope of the invention, for example, on electrical printed circuit boards, the coated surface areas formed from electrically conducting metal powder, for example, copper powder, can, after removal of the remaining loose metal powder, be further compressed to increase the electrical conductivity and/or fused.

In the performance of the process of the invention, the amplitude and frequency of the vibration on the shaped article can be coordinated to achieve maximum compression of the powdered coating material The coordination of amplitude and frequency of the vibration can be achieved in, many ways. For example two types of vibrators are useful, e.g., an air-pressure driven imbalance vibrator and a piezoelectric vibrator. The first-mentioned vibrator changes amplitude and frequency when the air pressure is varied. To extend the range of control, other vibrators with different masses and radii can be applied. Use of the piezoelectric vibrator permits controlling the frequency and amplitude independently by altering the control voltage correspondingly. Through the possibility of this mutual adjustment, the process of the invention can be used for substantially any type of powdered coating materials, because, by variation in the magnitude of both these adjustments, the respective properties and respective compositions of the coating materials used can be taken into account optimally. Thus, for example, the amplitude of the vibration can be adjusted to about the order of magnitude of the diameter of the particles of the powdered coating material to be used, for example, at 1 to 5 times the particle diameter.

In general, the direction of oscillation of the vibration is adjusted essentially perpendicular to the surface area of the object to be coated. The direction of oscillation of the vibration and/or the position of the surface area to be treated can, however, also be changed during the coating period. Preferably the vibration continues as long as the tacky surface is in contact with the toner. However, depending on the type of tacky surface the toned image may be damaged or deteriorated by toning too long. Thus, it may be desirable to begin the vibration subsequent to the time the toner has contacted the tacky surface. A preferred toning time period is 20 to 120 seconds.

The process of the invention can be performed particularly advantageously with the use of particulate or powdered coating material with an average particle size between 0.5 μm and 10 μm.

The new coating process of the invention makes use of the fact that a layer of powdered material is compressed by the effect of vibration with increasing sonic intensity $\Lambda$ first from a powder (bulk) density $\rho 0$ up to a maximum density $\rho max$. With further increase in sonic intensity $\Lambda$, the density in the layer decreases very rapidly down to disintegration of the layer into a fluidized bed.

On this basis of this knowledge, the new process is the imagewise coating, with the aid of vibration, of a surface with low hardness differentiation made tacky in areas, whereby the sonic intensity $\Lambda$ of this vibration is set in a sonic intensity range A, which lies between a sonic intensity $\Lambda_1$ and a sonic intensity $\Lambda_2$. At the sonic intensity $\Lambda_1$, a significant compression of the powdered coating material is achieved compared to the starting powder density $\rho 0$, while the upper limit $\Lambda_2$ of the sonic intensity to be used should be about that sonic intensity at which the maximum density $\rho$ max is attained. It would be conceivable that the sonic intensity $\Lambda_2$ could also be set beyond the maximum of the density. However, in view of the sharp drop in the density curve evident in FIG. 1 beyond the maximum density $\rho$ max, it is advisable to the utmost possible not to exceed the sonic intensity value $\Lambda_2$ corresponding to the maximum density $\rho$ max.

For the coating, different types of powdered coating materials can be considered, for example, color pigment powder, carbon powder, metal powder, particularly copper powder, etc. The particle size of this powder should be between 0.5 μm and 10 μm. For this, it is recommended that a statistical particle size distribution (Gaussian bell curve) be provided, in which the maximum portion of the powdered coating material to be used is about at the average particle size of the cited range. Maximum density can be achieved with such a particle size distribution in the powdered coating material.

Figure 2:
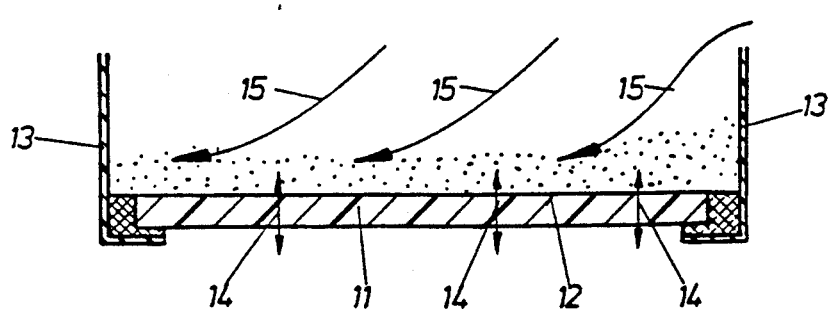
FIG. 2 is a view in cross-section of a frame showing a first coating embodiment of the process according to the invention.

As illustrated in FIG. 2, an element 11 to be coated on its surface 12 is placed into a frame 13 in a manner to permit oscillation and is vibrated as indicated by the double-headed arrows 14. Preferably, the vibration can be in the frequency range from 20 to 5000 Hz. The direction of oscillation should be as perpendicular as possible to the surface 12 of the element 11—as indicated by the double-headed arrows 14. While the element 11 vibrates in the direction of the double-headed arrows 14, powdered coating material is deposited in the direction of the arrows 14, powdered coating material is deposited in the direction of the arrows 15 on the surface 12 within the frame 13. The coating step thus started is conducted for a predetermined coating period, for example, between about 0.5 minute and 10 minutes with continuous vibration of the element 11. After the end of the coating period, the vibration is halted. The coating material deposited in the frame 13 is removed, for example, by vacuum. The coated element 11 is removed from the frame 13 and processed further in a manner described below.

Figure 3:
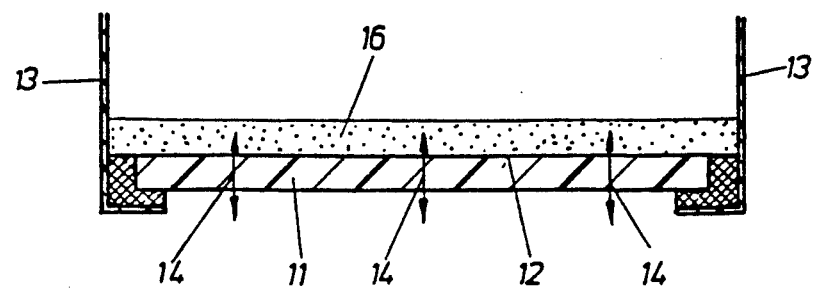
FIG. 3 is a view in cross-section of a frame showing a second coating embodiment of the process according to the invention.

As illustrated in FIG. 3, an element 11 to be coated on its surface 12 is again placed into a frame 13 so that the surface to be coated faces up. A layer 16 of coating material is formed within the frame 13 on the surface 12 to be coated. After this layer 16 has been deposited on the element 11, the element is vibrated in the direction of the double-headed arrows 14 for the predetermined coating period.

Figure 4:
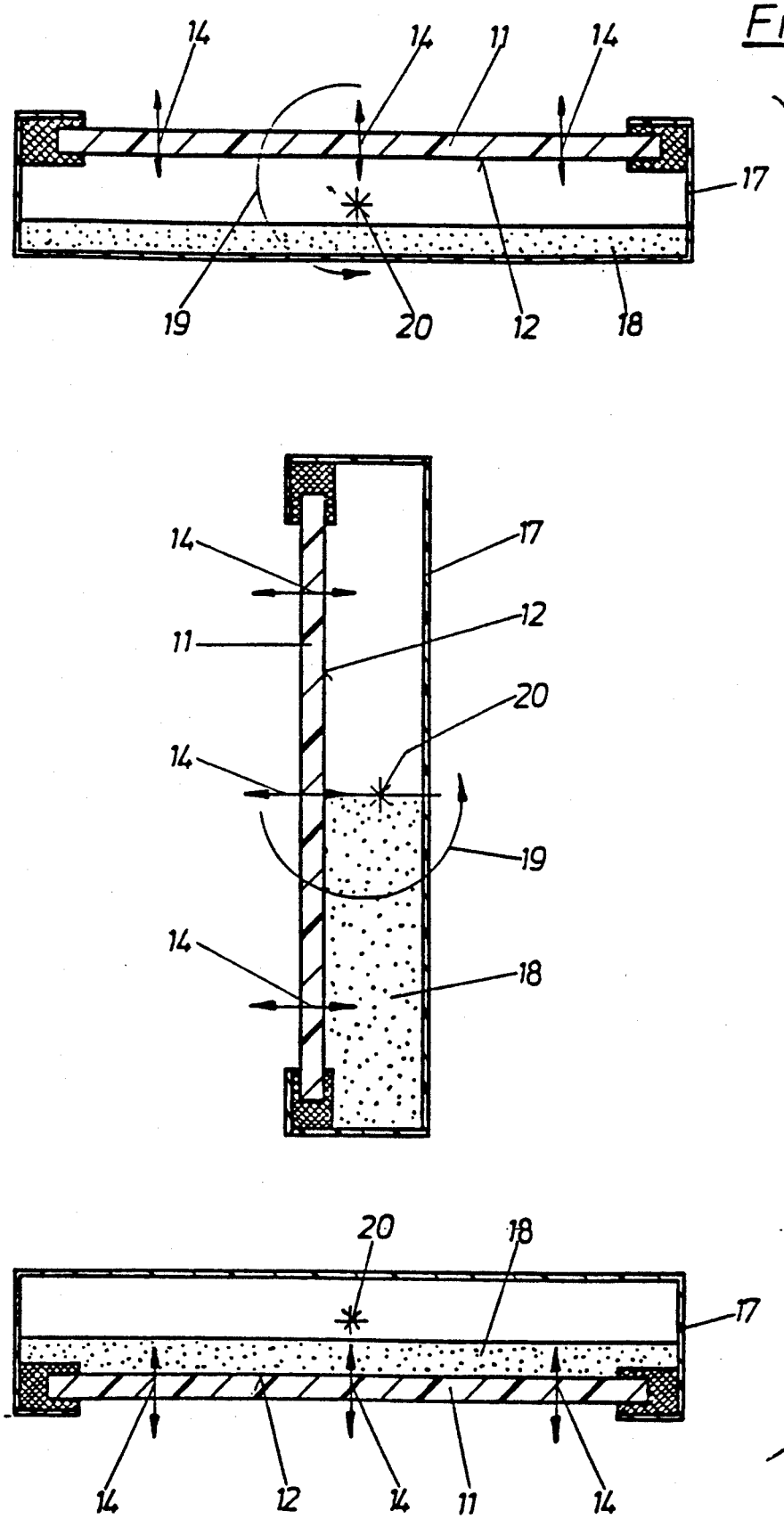
FIG. 4 is a view in cross-section of a saucer-shaped container showing in three consecutive stages a third coating embodiment of the process according to the invention.

In the process method indicated in three consecutive steps as illustrated in FIG. 4, a flat, for example, saucer-shaped holder 17 is provided instead of the frame indicated in Figs. 2 and 3; the material to be used for coating is deposited on the bottom of the holder at 18. The element 11 to be treated is placed into the rim of the then upper opening of the holder so that the surface 12 to be coated is on the bottom and faces the coating material 18 lying on the bottom of the holder. After being set into the rim of the opening of the holder 17, the element 11 is set into vibration in the direction of the double-headed arrow 14, for example, at a frequency of 20 to 5000 Hz. The holder 17 with the vibrating element 11 set into the rim of its opening is then pivoted in the direction of arrow 19 around the axis 20 through the intermediate position shown in the center of FIG. 4 until the holder 17 reaches the upside down position shown at the bottom of FIG. 4, where the coating material 18 is now distributed on the surface 12 of the element 11 facing up. The vibration indicated by the double-headed arrows 14 is maintained in this position of the holder 17 for the desired treatment period.

Instead of the vibration being started after the element 11 is placed into the rim of the opening of the holder 17, the vibration can also be started when the holder 17 with the attached element 11 has reached the position shown at the bottom of FIG. 4.

After the end of the desired coating time, the holder 17 with the attached element 11 is pivoted back to the position shown at the top of FIG. 4 so that the coating material 18 falls from the surface 12 and collects again on the bottom of the holder 17. The return rotation of the holder 17 with the attached element 11 can take place while the vibration is maintained in the direction of the double-headed arrows 14. This offers the advantage that the compressing effect caused by the vibration on the coating material 18 operates so that the coating material 18 maintained in a compacted state also picks up such particles that would normally adhere to the nontacky areas of the surface 12 for physical reasons.

The process operation according to the diagram in FIG. 4 can also be conducted in a manner such that the rotation of the holder 17 with element 11 set into the rim of the opening is repeated one or more times around axis 20 in the direction of the arrow 19 while vibration is continued in order to accomplish in this manner a multistep coating operation. It would also be conceivable actually to continuously perform the rotation of the holder 17 with the element 11 placed into the rim of its opening around the axis 20 in the direction of the arrow 19 with continuous vibration of the element 11.

Figure 5:
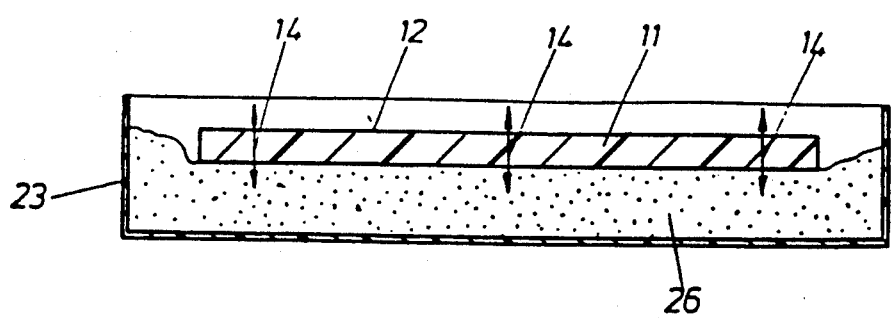
FIG. 5 is a view in cross-section of a container showing a fourth coating embodiment of the process according to the invention.
Figure 6:
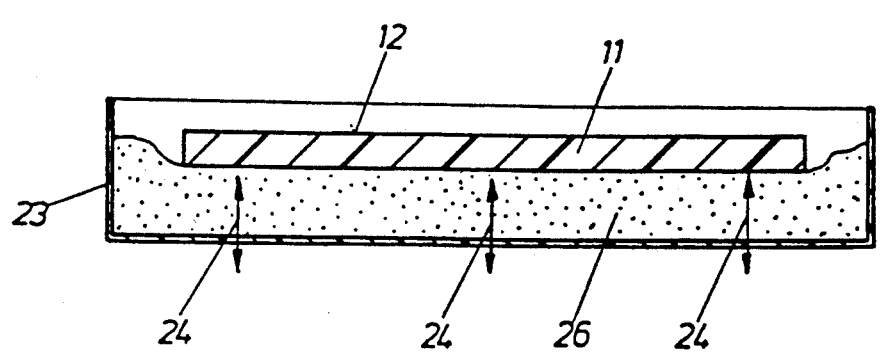
FIG. 6 is a view in cross-section of a container showing a fifth coating embodiment of the process according to the invention.

Another embodiment of the coating process is presented with the aid of FIGS. 5 and 6. As illustrated in FIG. 5, an open top, saucer-shaped holder 23 is provided, in the interior of which a layer 26 of coating material is formed. The element 11 to be treated with its surface 12 to be coated is placed on this layer 26, and again the element 11 is vibrated for the period of the desired coating time, as is indicated by the double-headed arrows 14. In this embodiment also, the direction of oscillation of the vibration is essentially perpendicular (right-angled all around) to the surface 12 or a plane tangent to surface 12. At the end of the coating time, the element 11 is lifted from the layer 26 and treated further in the manner described below.

A variation of the process method according to FIG. 5 is illustrated by FIG. 6 to the effect that not the element 11 but rather the holder 23 with the layer 26 of coating material contained in it is vibrated as is indicated by the double-headed arrows 24 in FIG. 6. The vibration is thereby transferred from the holder 23 onto the coating material of the layer 26 and from there also to the element 11 to be treated. In this case too, an intensive occlusion of the particles of the coating material occurs in the tackified areas of the surface 12.

Figure 7:
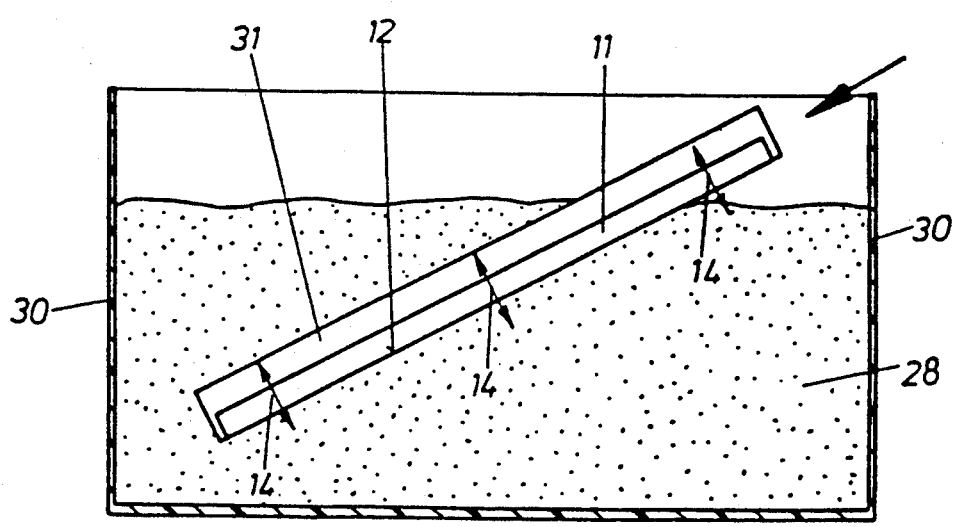
FIG. 7 is a view in cross-section of a container showing a sixth coating embodiment of the process according to the invention.

Finally, FIG. 7 illustrates an embodiment wherein the coating material 28 is placed in a box-type container 30 and exhibits at first only the standard powder density $pO$ shown in FIG. 1. The vibrating element 11 with its bare surface 12 to be coated is immersed in this coating material 28. In FIG. 7, 31 indicates a device transferring the vibration onto element 11, wherein the double-headed arrows again show that the direction of oscillation of the vibration should be about perpendicular (right angled on all sides) to the surface 12 or a plane tangent to the surface 12. The element 11 immersed in the coating material 28 behaves relative to the coating of the tacky areas of the surface 12 practically the same as the element 11 shown in FIG. 5. In the immersion of the element 11 in the coating material, it would be conceivable also to transfer the vibration from the holder 30 through the coating material 28 to the element 11. However, this appears less useful, because the compression of the coating material 28 resulting from the vibration leads to the expectation that an immersion of the element 11 in the coating material 28 would be significantly more difficult.

Figure 8:
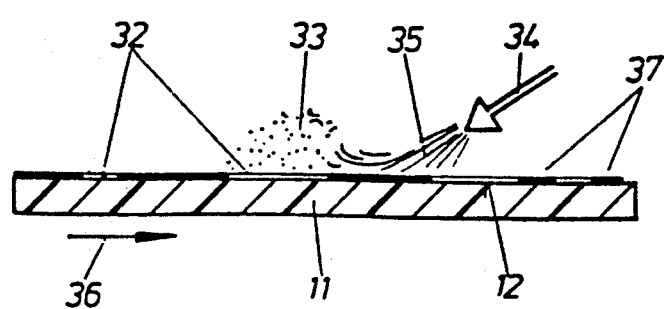
FIG. 8 is a schematic diagram of an embodiment of removing excess particulate coating material after coating.

After the actual coating operation, which can be conducted according to any of the embodiments of FIGS. 2 to 7, loose coating material 32 should be removed from the coated surface 12 of element 11. This can be done simply by blowing. For this purpose, FIG. 8 shows an air spray 34 with which is produced a stream of air 35 directed onto the surface 12, while the element 11 is moved under the air spray 34 in the direction of the arrow 36. The very fine, loose particles 32 of the coating material remaining after the actual coating process on the surface 12, primarily its nontacky areas, but also on the coatings themselves, are blown away in the form of a puff of dust 33. There remains a sharply defined coating 37 of the previously tacky areas of the surface 12. This coating 37 is outstanding for high density and firm bonding with the surface 12, whereby the tacky material on the surface 12 within the coating 37 is incorporated in the coating material. This bonding of the coating 37 with the surface 12 suffices for many purposes. A further consolidation of the coating 37 can be achieved by posthardening the tacky material within the coating 37 by the effect of temperature or other physical treatment. When the coating 37 is formed from metal powder and needs to be made electrically conducting, the coating 37 can be fused, whereby, optionally, the incorporated tacky material can be eliminated from the coating 37 and the sintered, now practically completely metallic coating 37 from the sintering can enter into direct bonding with the material of element 11 or a surface layer formed on it.

EXAMPLES

The following examples illustrate but do not limit the invention.

EXAMPLE 1

A solution of 3.25 g of dimethyl ester of 2,6-dimethyl-4-(2'-nitrophenyl)-1,4-dihydropyridine-3,5-dicarboxylic acid and 3.25 g of diethyl ester of 2,6-dimethyl-4-(2'-nitrophenyl)-1,4-dihydropyridine-3,5-dicarboxylic acid in 100 ml of methyl ethyl ketone is applied by centrifuging on the inside of a 14 inch (35.56 cm) color TV screen. The thickness of the dried layer is 1.2 $\mu$m. The coated screen is then placed on a television exposure table used for this purpose and exposed for 40 seconds through a shadow mask having slit-shaped openings, utilizing a 1000 W mercury vapor lamp at a distance of 20 cm from the coating. After exposure of the lines for the first color it is toned with a green light emitting phosphor powder (average particle diameter 4 $\mu$m) whereby a pattern of green emitting lines is formed. For this purpose the screen is firmly fixed with face down on the opening of a container which contained on its bottom a one inch (2.54 cm) layer of the green phosphor. An air-pressure imbalance vibrator is fixed to the container. After starting vibration the whole package is slowly rotated by 270° back and forth so that the toner powder is in contact with the screen for 35 seconds. The main frequency of the vibration is 200 Hz. The amplitude of the vibration perpendicular to the screen surface is 10 $\mu$m and is calculated from acceleration measurements taken with an acceleration sensor fixed to the screen. The screen is removed from the container and the excess phosphor is blown off with air. A highly uniform phosphor pattern is obtained.

The exposure and toning process is repeated to give blue and red phosphor patterns.

EXAMPLE 2

A squared cavity partly filled with 2 $\mu$m gold powder is closed dust tight with a ceramic substrate as cover. A substrate coated with a 1.5 $\mu$m thick layer of the light sensitive material of Example 1 which becomes tacky upon exposure, is imagewise exposed to UV light. The imagewise tacky surface faces the gold powder in the cavity. At the back side of the substrate a piezo translator (type P-245.20, Physik-Instrument GmbH, D-7517 Waldbronn, Germany), is mounted. The translator is activated periodically (100 Hz) by a controller unit (PI 272, same vendor) forcing a displacement of 10 $\mu$m at the operating voltage of 1000 V. This sets the substrate into corresponding vibration. The cavity is then turned over allowing the gold to flow across the vibrating surface. The vibration is thus transferred into the toner. By repeating the turning and flow across several times a high density powder image is formed on the tacky areas. The toner reception reaches 10 mg/cm$^2$ at a line/space resolution of 25 $\mu$m.

We claim:

1. A process for coating tacky surface areas of a shaped object with particulate coating material comprising: (a) bringing the particulate coating material into contact with the surface to be coated containing imagewise tacky surface areas, and (b) removing excess particulate coating material, the improvement wherein the particulate coating material in contact with the surface to be coated is compressed beyond its bulk density by continuous vibration for at least a portion of the time the particulate coating material is in contact with the surface to be coated, and after cessation of contact of the particulate coating material with the surface to be coated, remaining loose particulate coating material is removed from the coated surface.

2. A process according to claim 1 wherein the surface to be coated is contacted with particulate coating material while it is in upwardly direction and the vibration is induced from the surface to be coated and/or against the surface to be coated into the particulate coating material.

3. A process according to claim 2 wherein the particulate coating material is applied to the surface to be coated after the surface has been made to vibrate.

4. A process according to claim 2 wherein the particulate coating material is applied to the surface to be coated and then the surface to be coated is set into vibration compressing the coating material.

5. A process according to claim 2 wherein the surface to be coated in vibrating state is faced in, an upwardly direction and a layer of particulate coating material is accumulated in the tacky surface areas.

6. A process according to claim 1 wherein the surface to be coated is placed on the vibrating, compressed particulate coating material.

7. A process according to claim 1 wherein the surface to be coated is immersed in the vibrating, compressed particulate coating material.

8. A process according to claim 1 wherein residual loose particulate coating material is removed from the coated surface by means of a stream of a gaseous medium.

9. A process according to claim 1 wherein after residual loose particulate coating material is removed the particulate coating material on the tacky surface is compressed further, by fixed continuous vibration.

10. A process according to claim 9 wherein after the particulate coating material on the tacky surface is compressed further it is fixed.

11. A process according to claim 1 wherein the tacky surface areas were coated with electrically conductive metal particulate coating material to form an electrical circuit and after removal of residual loose particulate metal coating material the metal particulate coating material on the electric circuit is compressed further and/or fused to increase the electrical conductivity.

12. A process according to claim 1 wherein the amplitude and frequency of the vibration at the surface of the object to be coated are coordinated to attain maximum compression of the particulate coating material.

13. A process according to claim 12 wherein the amplitude of the vibration is adjusted to about the order of magnitude of 1 to 5 times the particle diameter of the particulate coating material.

14. A process according to claim 12 wherein the oscillation direction of the vibration is adjusted essentially in a direction norma to the surface area of the object to be coated.

15. A process according to claim 12 wherein the oscillation direction of the vibration and/or position of the surface area of the object to be coated are changed during the coating period.

16. A process according to claim 1 wherein the particulate coating material has an average particle size ranging from about 0.5 to 10 $\mu$m.

17. A process for coating tacky surface areas of a shaped object with particulate coating material comprising: (a) bringing the particulate coating material into contact with the surface to be coated containing imagewise tacky surface areas, and (b) removing excess particulate coating material, the improvement wherein the particulate coating material, about 0.5 to 10 $\mu$m average particle size, in contact with the surface to be coated is compressed beyond its bulk density by continuous vibration having an amplitude of vibration of 1 to 5 times the particle diameter of the particular coating material for at least a portion of the time the particulate coating material is in contact with the surface to be coated, and after cessation of contact of the particulate coating material with the surface to be coated, remaining loose particulate coating material is removed from the coated surface.

* * * * *